United States Patent [19]

Weaver et al.

[11] Patent Number: 5,227,259
[45] Date of Patent: Jul. 13, 1993

[54] APPARATUS AND METHOD FOR LOCATING AND ISOLATING FAILED CELLS IN A BATTERY

[75] Inventors: Robert D. Weaver, Palo Alto; Francis L. Tanzella, Newark, both of Calif.

[73] Assignee: Electric Power Research Institute, Inc., Palo Alto, Calif.

[21] Appl. No.: 736,073

[22] Filed: Jul. 24, 1991

[51] Int. Cl.$^5$ .................... H01M 10/44; H01M 2/00
[52] U.S. Cl. ...................... 429/49; 429/61; 429/90; 324/434
[58] Field of Search ............. 429/90, 61, 49

[56] References Cited

U.S. PATENT DOCUMENTS

| | | |
|---|---|---|
| 1,803,486 | 5/1931 | Rau, Jr. . |
| 1,807,381 | 5/1931 | Butler . |
| 1,851,896 | 3/1932 | Eckhardt et al. . |
| 1,941,964 | 1/1934 | Gustin et al. . |
| 2,367,905 | 1/1945 | Van Horn . |
| 3,076,079 | 1/1963 | McAlister . |
| 3,146,326 | 8/1964 | Thorne . |
| 3,425,017 | 1/1969 | Schockelt . |
| 3,509,508 | 4/1970 | Kraemer et al. . |
| 3,689,776 | 9/1972 | Evans . |
| 3,986,894 | 10/1976 | Gilberti, Jr. . |
| 4,095,207 | 6/1978 | Hay et al. . |
| 4,252,869 | 2/1981 | Heitz et al. ............................ 429/49 |
| 4,269,905 | 5/1981 | Wedlake ................................. 429/8 |
| 4,376,809 | 3/1983 | Bindin . |
| 4,795,685 | 1/1989 | Bones . |
| 4,883,726 | 11/1989 | Peled et al. . |
| 4,886,715 | 12/1989 | McCullough, Jr, et al. . |
| 4,935,315 | 6/1990 | Herrin ..................................... 429/50 |

*Primary Examiner*—Olik Chaudhuri
*Assistant Examiner*—M. Nuzzolillo
*Attorney, Agent, or Firm*—Flehr, Hohbach, Test, Albritton & Herbert

[57] ABSTRACT

An apparatus and method for locating and electrically isolating failed cells in a network of cells is disclosed. The apparatus includes a device for sampling voltage and current levels of each of the cells of the battery. Another device compares the sampled voltage and current levels to voltage and current limits to determine whether a cell has failed. If a cell has failed, control circuitry produces an activation signal which is conveyed to a switch associated with the failed cell. The activation signal drives a heating element of the switch. The heating element, which surrounds a fusible link of the switch, melts the fusible link. The fused link congregates at the base of the switch. In the case of a parallel network of cells, the fused link forms an open circuit, while in the case of a series network of cells, the fused link forms a bypass circuit. Consequently, the switch isolates the failed cell from the good cells remaining in the battery.

18 Claims, 9 Drawing Sheets

APPARATUS AND METHOD FOR LOCATING AND ISOLATING FAILED CELLS IN A BATTERY

BRIEF DESCRIPTION OF THE INVENTION

This invention generally relates to an apparatus and method for successfully operating a battery notwithstanding the presence of a failed cell within the battery. More particularly, it relates to an apparatus and method for locating and then isolating a failed cell without interrupting the electrical environment of the remaining cells in the battery.

BACKGROUND OF THE INVENTION

Batteries for the storage of electrical energy are known in the art. They are used in a wide variety of applications. The applications vary from space satellites, which usually will represent relatively small energy storage requirements, through electric vehicles which represent energy storage at the 50 kilowatt-hour level, to electric utility load leveling batteries which will require 100 megawatt-hour levels of energy storage. The number of cells associated with a battery may vary from 10 to over 2,000,000. As the complexity of a battery increases, it is increasingly necessary to provide means for locating and isolating a failed cell within the battery. Otherwise, a failed cell can deplete energy from good cells or actually cause physical damage to good cells.

The network of cells in a battery may be connected in series or in parallel. A failed or failing cell has a substantially adverse impact on the remaining good cells. For cells in parallel, a cell which has failed in such a manner as to create a short-circuit can drain the capacity of all of its parallel network members. Similarly, for cells in series, a cell which has failed in such a manner as to become non-conductive, or to become an open-circuit, removes from access the capacity of its undamaged series members. The failed cell problem is compounded by the fact that cells generally fail in a random manner, thus preventing any solution based upon a predicted location of a failed cell or the predicted kind of failure of the cell.

In the prior art, these problems have been addressed through the utilization of fuses. The successful use of fuses requires excess current flow through the cell as a result of cell failure. The excess current must be sufficient to melt the fusible link of the fuse. This approach is unreliable since a failed cell need not result in current of sufficient magnitude to cause the desired fusing action.

OBJECTS AND SUMMARY OF THE INVENTION

It is a general object of the present invention to provide an apparatus and method for ongoing operation of a battery despite the presence of failed cells.

It is a more particular object of the present invention to detect the presence of a failed cell in a battery.

It is a related object of the present invention to provide an apparatus and method for isolating failed cells.

It is another object of the present invention to isolate failed cells without reliance on a fuse.

It is another object of the present invention to provide a mechanism for isolating failed cells regardless of their position within the electrical network.

It is still another object of the present invention to isolate failed cells in an environment without gravity.

These and other objects are achieved by an apparatus and method for locating and electrically isolating failed cells in a network of cells of a battery. The apparatus and method prevent a failed cell from interfering with the operation of functional cells in the battery. The apparatus includes a device for sampling voltage and current levels of each of the cells of the battery. Another device compares the sampled voltage and current levels to voltage and current limits to determine whether a cell has failed. If a cell has failed, a switching mechanism produces an activation signal which is conveyed to a switch associated with the failed cell. The activation signal drives a heating element of the switch. The heating element, which surrounds a fusible link of the switch, melts the fusible link. The fused link congregates at the base of the switch. In the case of a parallel network of cells, the fused link forms an open circuit, while in the case of a series network of cells, the fused link completes a circuit around the failed cell. Consequently, the switch isolates the failed cell from the good cells remaining in the battery.

BRIEF DESCRIPTION OF THE DRAWINGS

Other objects and advantages of the invention will become apparent upon reading the following detailed description and upon reference to the drawings, in which.

DETAILED DESCRIPTION OF THE INVENTION

Figure 1:
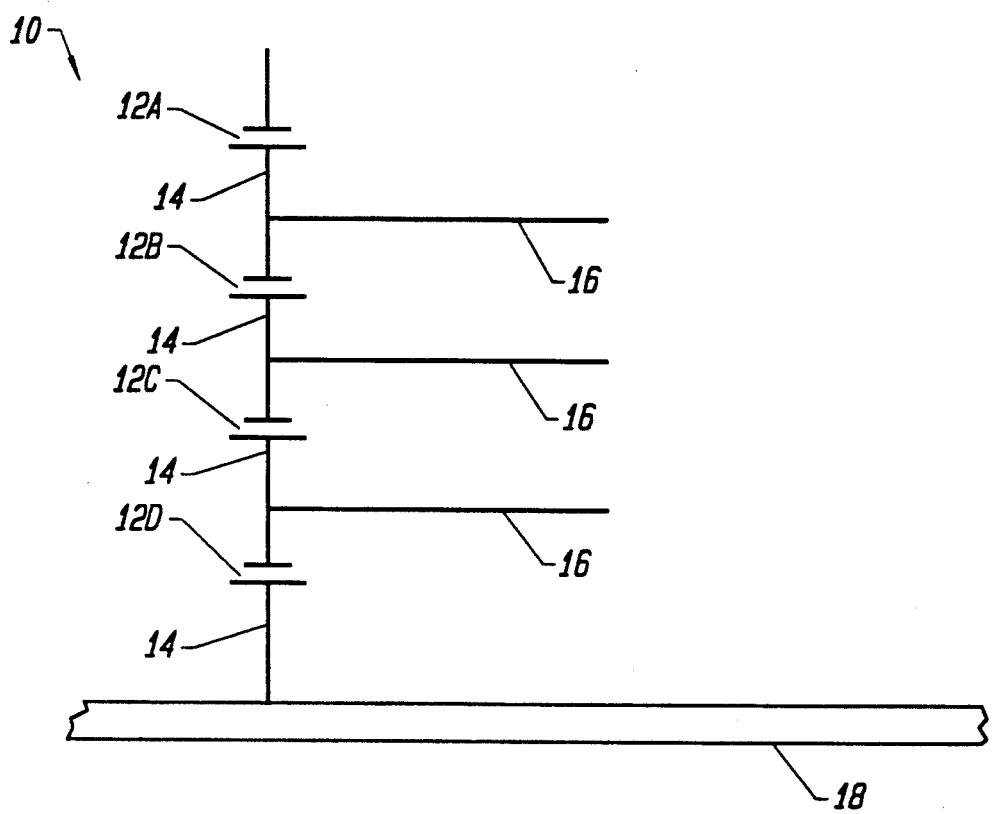
FIG. 1 is a schematic view of a number of serial cells of a battery.

Turning now to the drawings, wherein like components are designated by like reference numerals in the various figures, attention is initially directed to FIG. 1 which depicts a battery 10. The battery 10 includes a number of cells 12 which are serially connected by electrical conductors 14, as is known in the art. As one can readily appreciate, if a cell, for instance 12A, fails and results in an open element, the remaining cells in the series, cells 12B, 12C, and 12D, will be electrically isolated.

Figure 2:
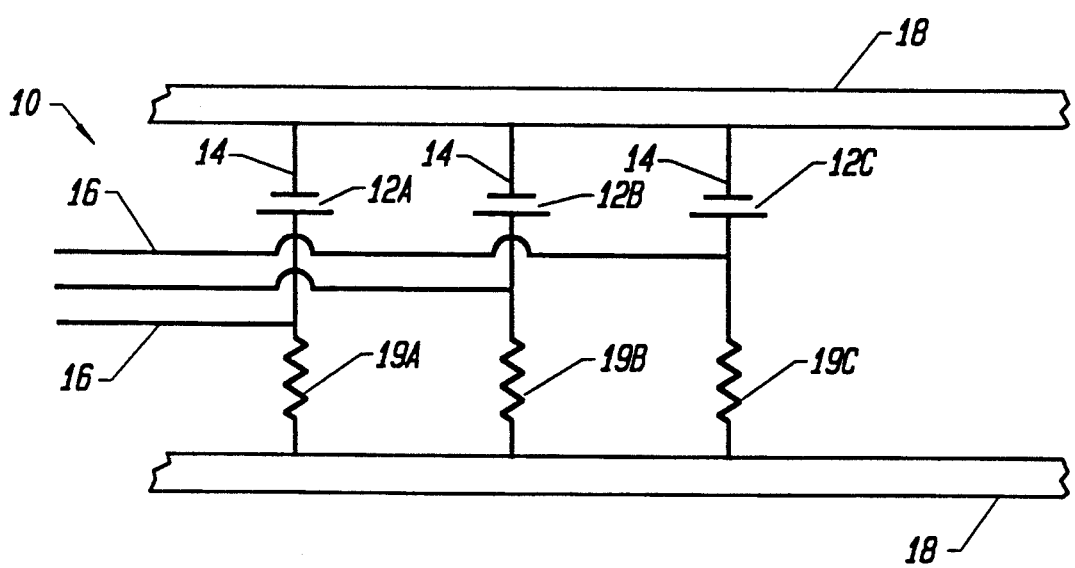
FIG. 2 is a schematic view of a number of parallel cells of a battery.

Turning to FIG. 2, a battery 10 is depicted with a number of cells 12 which are connected in parallel by conductors 14, resistors 19 for current measurement, and buses 18. Again, if a cell, for instance 12A, fails and represents a short, the remaining cells in the series, cells 12B and 12C, would be subject to discharge through the short-circuited cell. Consequently, the energy from good cells 12B and 12C would be lost.

Thus, to prevent the open or short circuit effects of a failed cell from disrupting the operation of the remaining good cells, the failed cells must be quickly located and isolated. Current and voltage information is required to determine the condition, or health, of individual cells in the series of cells of FIG. 1. The current in the series arrangement needs to be measured only at one point in the series circuit. The voltage is preferably sampled between cells so as to provide information about the condition of each cell.

To obtain the required current and voltage information for the series cell arrangement of FIG. 1, sampling wires 16 are provided. Specifically, between each cell 12, a sampling wire 16 is coupled to conductor 14.

Referring to FIG. 2, the parallel cell arrangement is depicted. The individual cells 12 are interconnected by buses 18. Once again, sampling wires 16 are utilized to collect data. In the parallel configuration, one measurement of voltage suffices for the array and one measurement of current must be made for each cell.

Figure 3:
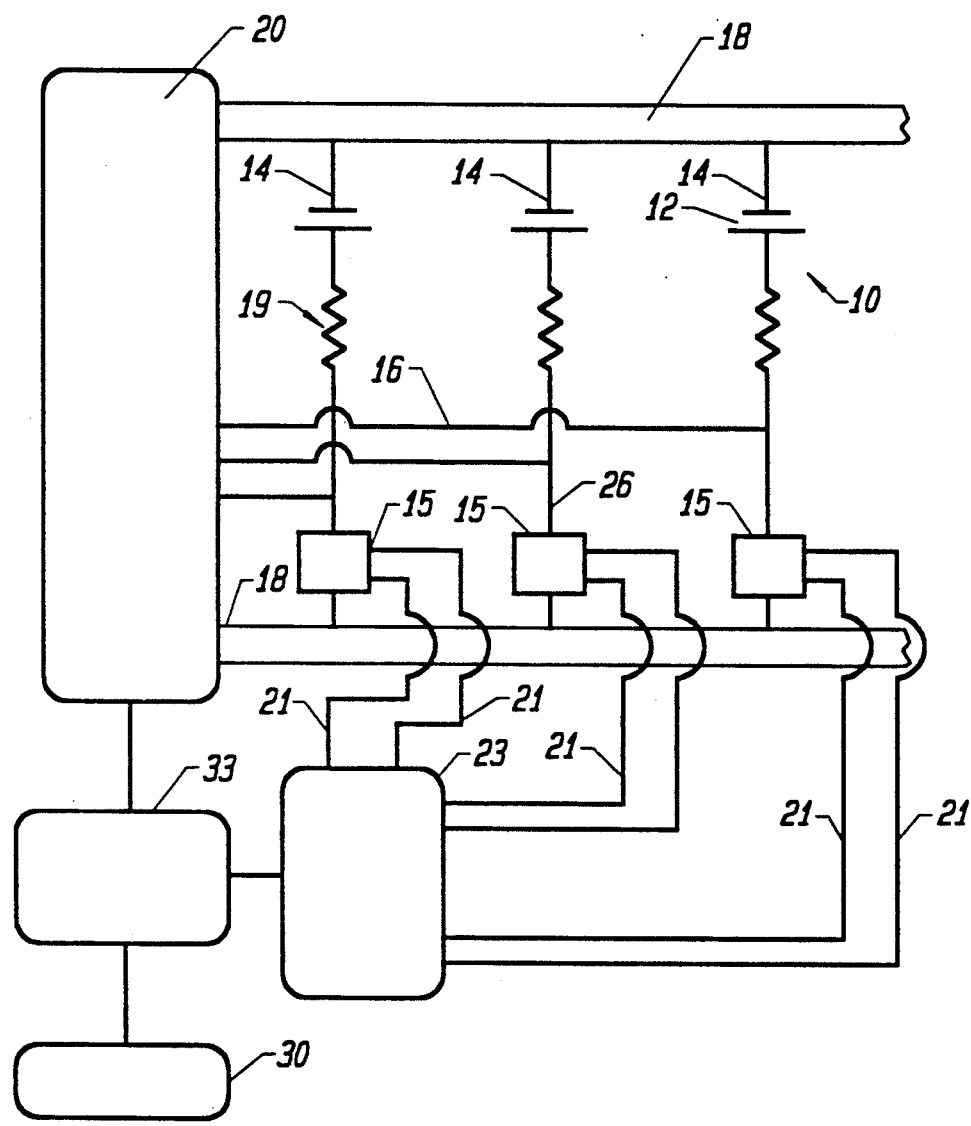
FIG. 3 is a schematic view of an apparatus for locating and isolating failed cells in a battery, in accordance with the present invention.

Turning now to FIG. 3, the parallel cell arrangement is depicted as being connected with the other elements of the present invention. Specifically, the sampling wires 16 and buses 18 are coupled to a sampling device 20. Preferably, sampling device 20 is a sequential sampling multiplexer. The output of sampling device 20 is coupled to a logic circuit 33. Preferably, logic circuit 33 is a microprocessor within a computer. A display 30 may be associated with the logic circuit 33.

In a preferable embodiment of the invention, the multiplexer 20, the logic circuit 33, and the power supply 23 are remotely located from the battery. A remote location is required, for instance, with the use of high temperature batteries, one example of which is the sodiumsulfur battery which operates at a high, 350° C., temperature.

As is known in the art, the logic circuit 33, or microprocessor, includes a memory which can store operating instructions and information regarding proper threshold voltage and current limits. The operating instructions, as formulated by standard programming techniques, compare the sampled current and voltage information, as relayed from the sampling device 20, to threshold current and voltage information.

The threshold information defines proper operating limits for the battery 10. Naturally, these limits vary with the kind of battery chemistry and complexity of the circuit for that battery. Current or voltage information outside defined limits will indicate a failing or failed cell.

After the logic circuit 33 has identified a failing or failed cell 12, it generates an activation signal, through standard techniques, which is conveyed to power supply 23. Power supply 23 then supplies a signal through activation wires 21. The signal from activation wires 21 powers the heating element 22 of the switch 15 which is associated with the failed or failing cell 12.

Figure 4:
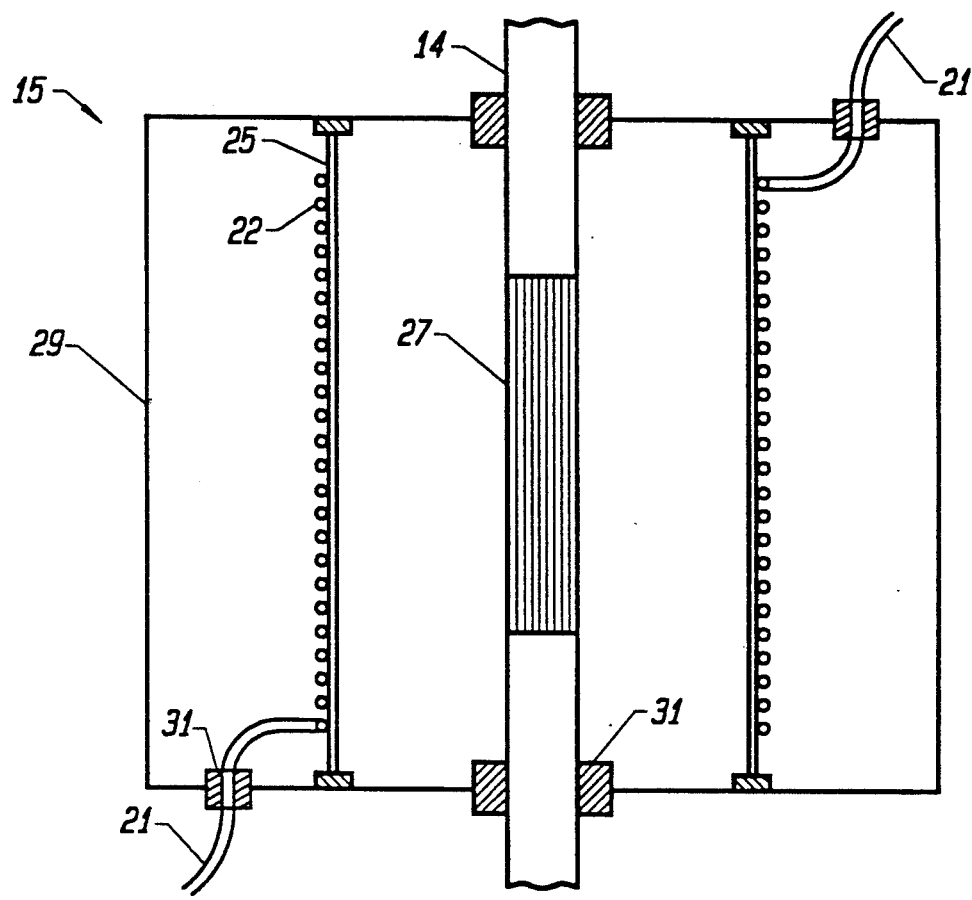
FIG. 4 is a cross-sectional view of an individual switch including a fusible link which is surrounded by a heater element, in accordance with the present invention.

The switch 15 of the present invention is more fully appreciated with reference to FIG. 4. FIG. 4 depicts a switch 15 connected to a protruding cell conductor 14, associated with a cell 12. Switch 15 includes a housing 29. Within the housing 29 is a heating coil 22. The heating coil 22 is coupled to a heater activation wire 21 through an electrical feed-through 31. The heating coil 22 is supported by a heating coil support 25.

Cell conductor 14 is coupled to a fusible link 27. When an energizing voltage is applied to coil 22 from power supply 23, current passes through the coil 22 and begins to generate heat. Eventually, the coil 22 generates sufficient heat to raise the temperature of the fusible link 27. With additional heat, the fusible link 27 will melt and flow toward the bottom of the switch housing 29. As used herein, "bottom" is defined as that region of the switch housing 29 closest to the gravitational center of the earth, assumed to be the bottom of the page in all figures. The fusible link 27 eventually forms a fused link, or stump, 32 at the bottom of the switch housing 29, as seen in FIG. 5.

The heating coil 22 is thereafter disengaged and the stump 32 cools to a solid state. The heater element may be disengaged after a predetermined period of time or after relevant current or voltage information has been measured by the logic circuit 33.

Figure 5:
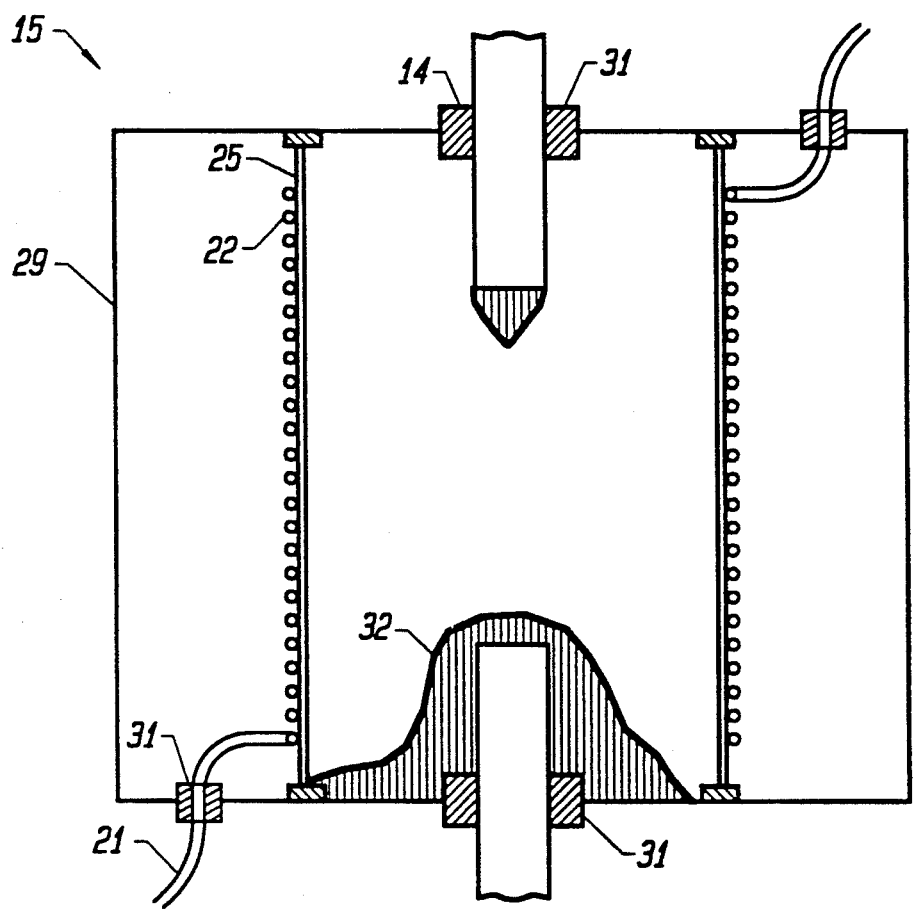
FIG. 5 is a cross-sectional view of an individual switch with a fusible link which has been melted and as a result has congregated at the base of the switch, thus providing the switching action of the invention.

This final state is depicted in FIG. 5. In this final state, with the cell conductor 14 disengaged from the fusible link 27, the circuit will be in an open-circuit condition.

Figure 6:
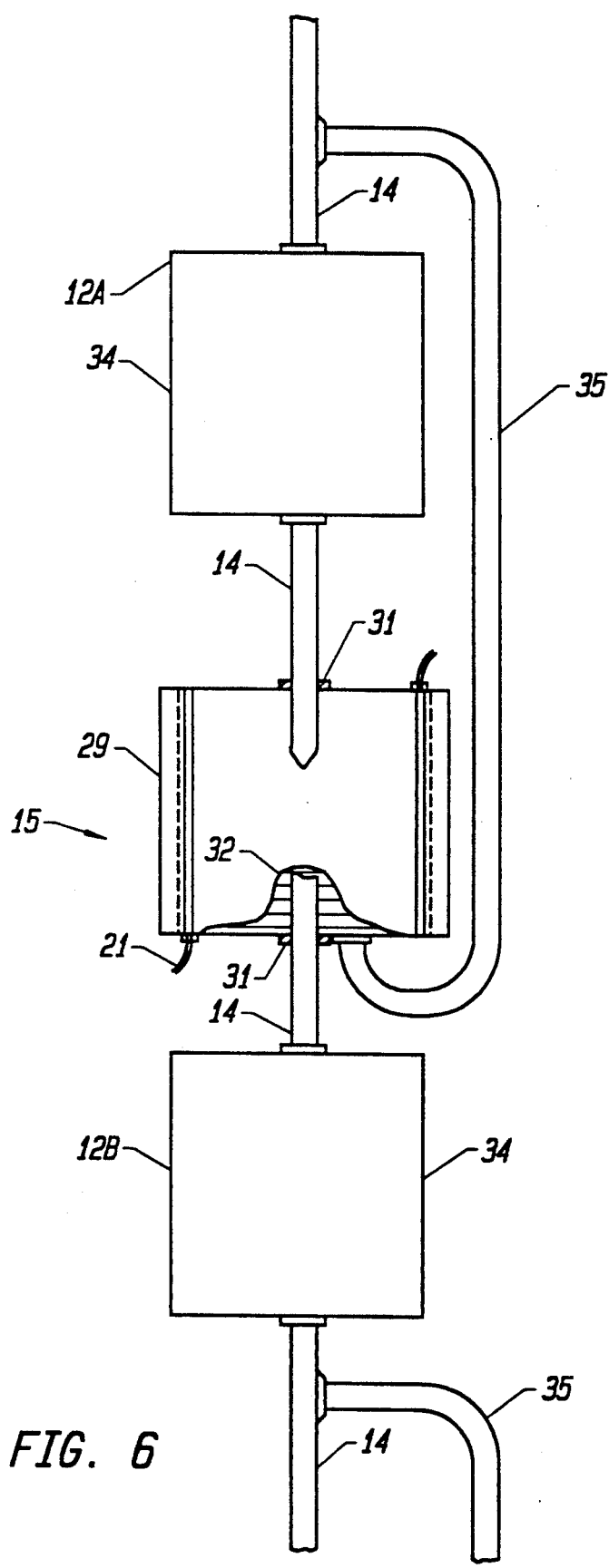
FIG. 6 is a cross-sectional view of a switch which is connected between two cells connected in series.

An embodiment for a series arrangement of cells is depicted in FIG. 6. In the figure, two cells 12A and 12B are connected in series with a switch 15 positioned between them. A switch bypass conductor 35 is provided. This bypass 35 may be made of the same gauge and material as the cell conductor 14, to be more fully described herein. The bypass 35 is connected to cell conductor 14 at one end and is connected to housing 29 at its other end. Consequently, the bypass is usually an open element. However, when the fusible link 27 is melted, the fused link, or stump, 32 at the base of the housing 29, forms an electrical connection with the bypass 35.

Thus, with the present invention, the electrical characteristics of each cell 12 are sampled and measured. If the measurements reveal that the cell 12A is not operating within given parameters or limits, a signal is activated. This signal drives a heating element 22 which surrounds a fusible link 27. The heating element 22 melts the fusible link 27. The melted portion congregates at the base of the switch housing 29 and thus completes a circuit between the housing and the conductor from cell 12B.

In a parallel arrangement of cells, the cell conductor 14 is disengaged from the fusible link 27. As a result, an open circuit is created and there is no danger of draining the remaining parallel cells. In a series arrangement of cells, the fused link 32 forms a connection with a bypass conductor 35. As a result, a bypass is created and there is no danger of isolating the remaining series cells.

Figure 7:
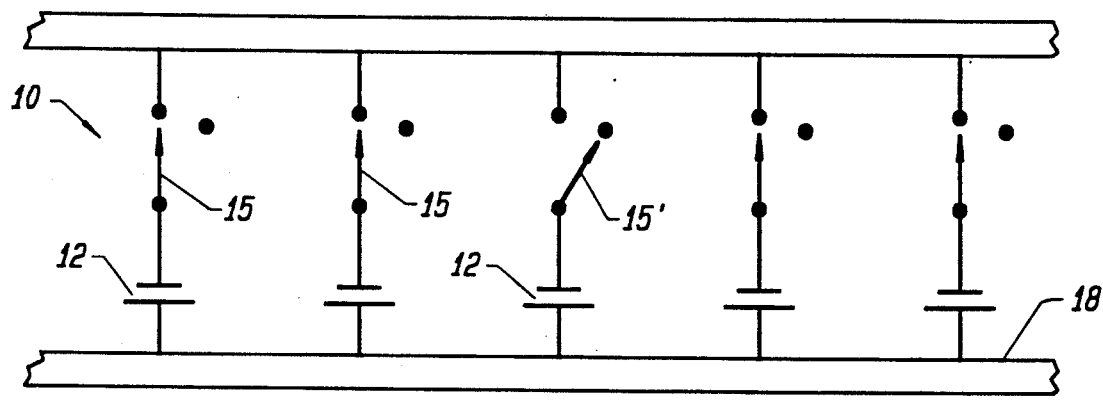
FIG. 7 is a schematic diagram of the use of switches in a parallel circuit of cells, in accordance with the present invention.
Figure 8:
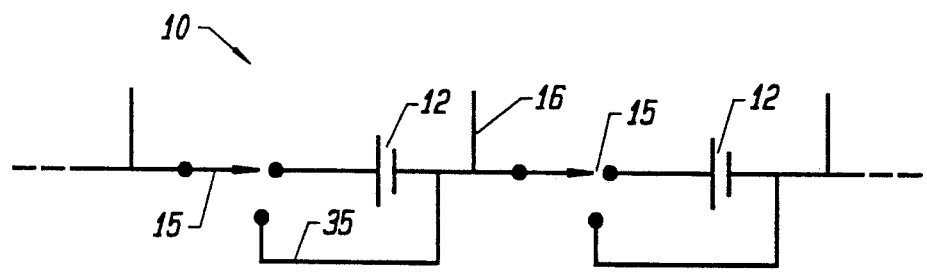
FIG. 8 is a schematic diagram of the use of switches in a series circuit of cells, in accordance with the present invention.
Figure 9:
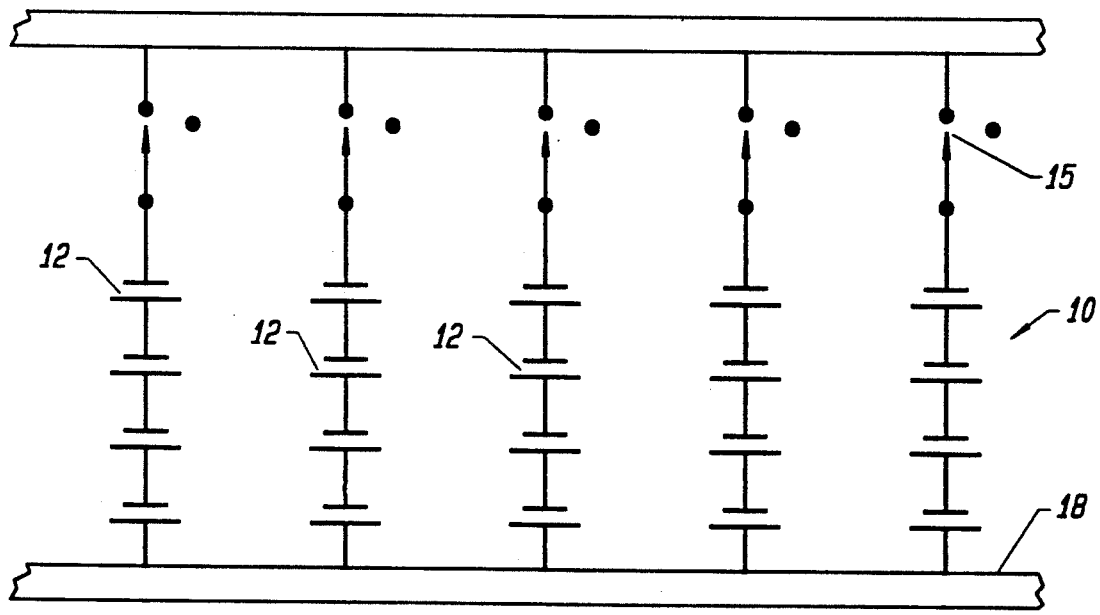
FIG. 9 is a schematic diagram of the use of switches in a combination series and parallel circuit of cells, in accordance with the present invention.

The functioning of a battery in accordance with the invention is more fully appreciated with reference to FIGS. 7, 8, and 9. FIG. 7 depicts a battery 10 consisting of a parallel circuit of cells 12. One switch, 15', of the parallel switches 15, has been activated in order to isolate the associated cell from the circuit. The remaining cells 12 contribute to the power and energy characteristics of the battery.

The switching action for a switch 15 in a battery 10 with series cells 12 is depicted in FIG. 8. As can be appreciated from the figure, the switch 15 will complete a circuit around the failed cell so that the remaining cells in the circuit may continue to provide battery action.

It is not necessary that there be one switch for each cell of a battery. The ratio of cells to switches can be greater than one. This is illustrated in FIG. 9 where a battery 10 consisting of cells 12 in a series-parallel network is schematically illustrated.

Figure 11:
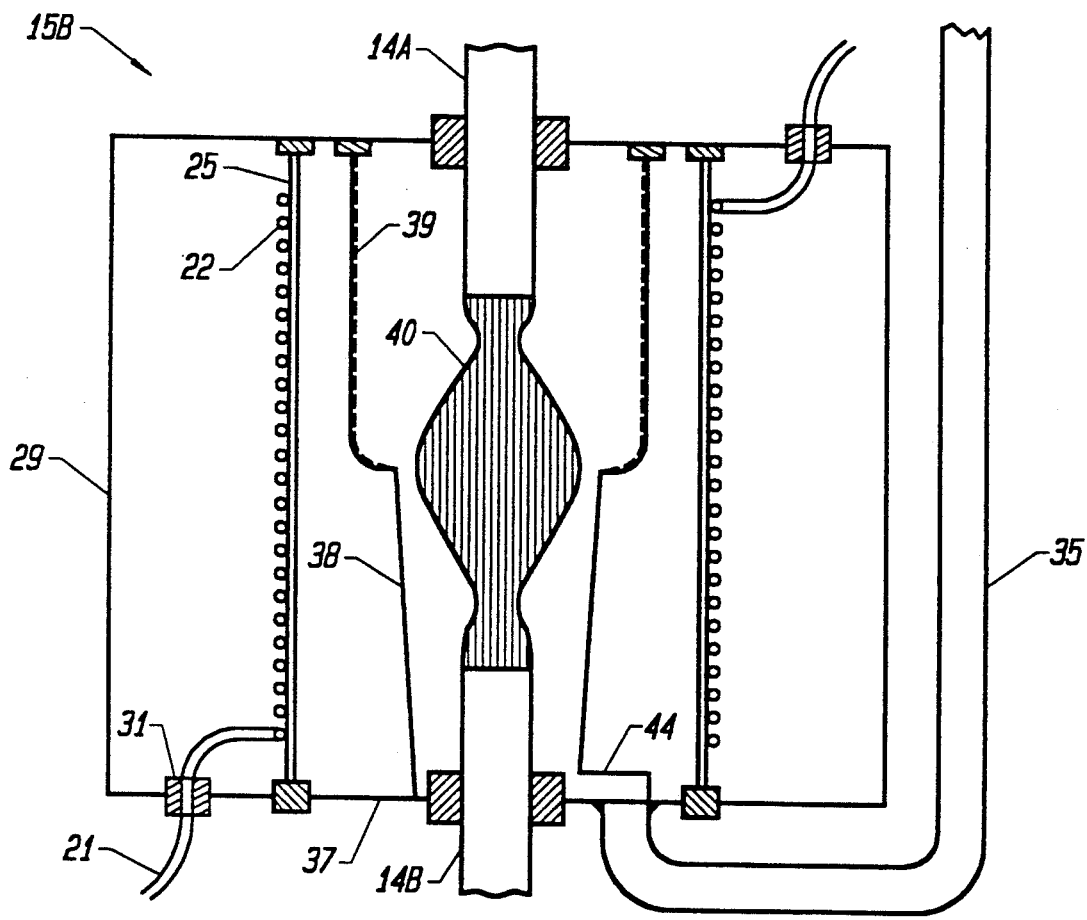
FIG. 11 is a cross-sectional view of the switch of FIG. 10 wherein the heating element has been activated and the fusible link is beginning to melt.
Figure 12:
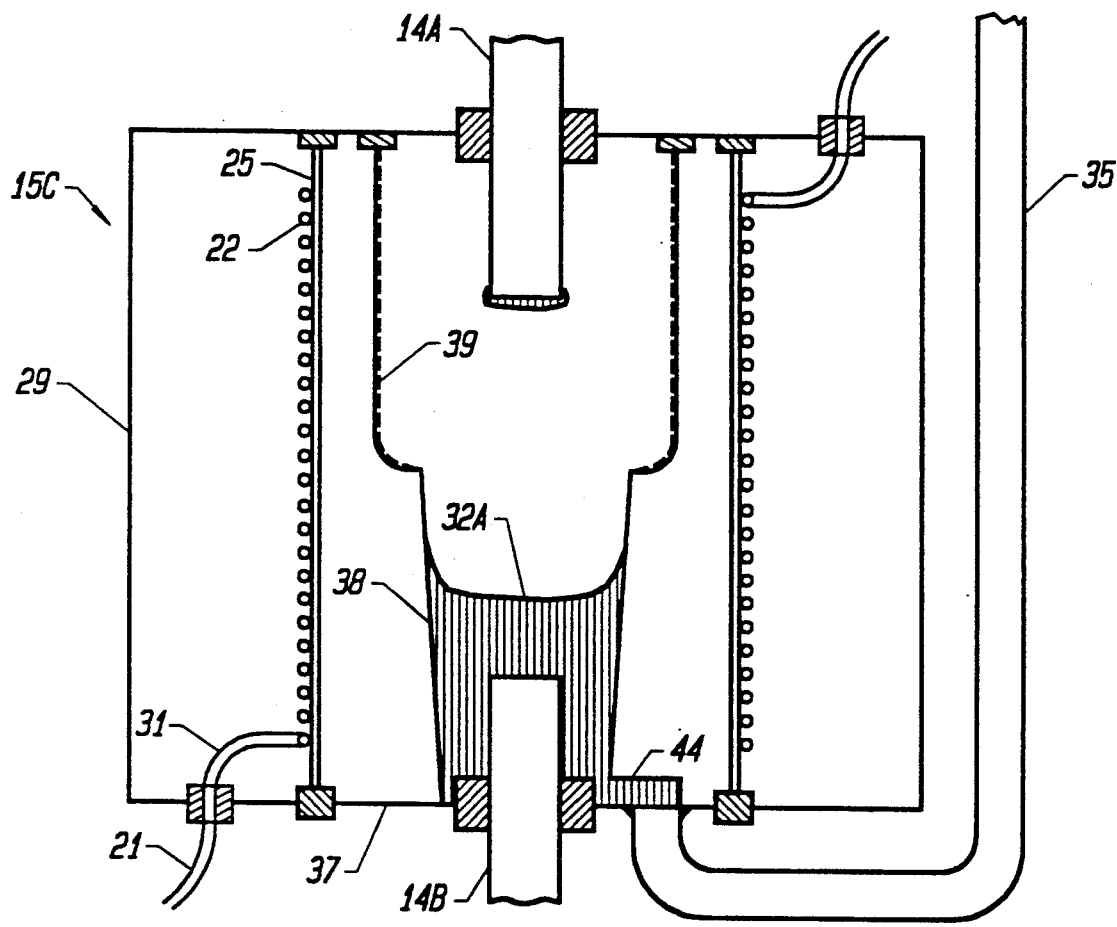
FIG. 12 is a cross-sectional view of the switch of FIG. 10 after the fusible link has been melted.

The switches described thus far have been of a design suitable for use in a gravity environment. Cells and batteries are also needed in the zero gravitational (zero-g) environment of outer space. For instance, batteries are used in satellites and in orbiting space stations. These batteries will also benefit by having available switches that can isolate a failing cell. The design and operation of a switch of this invention that is intended for use in a zero-g application is shown in FIGS. 10, 11, and 12.

Figure 10:
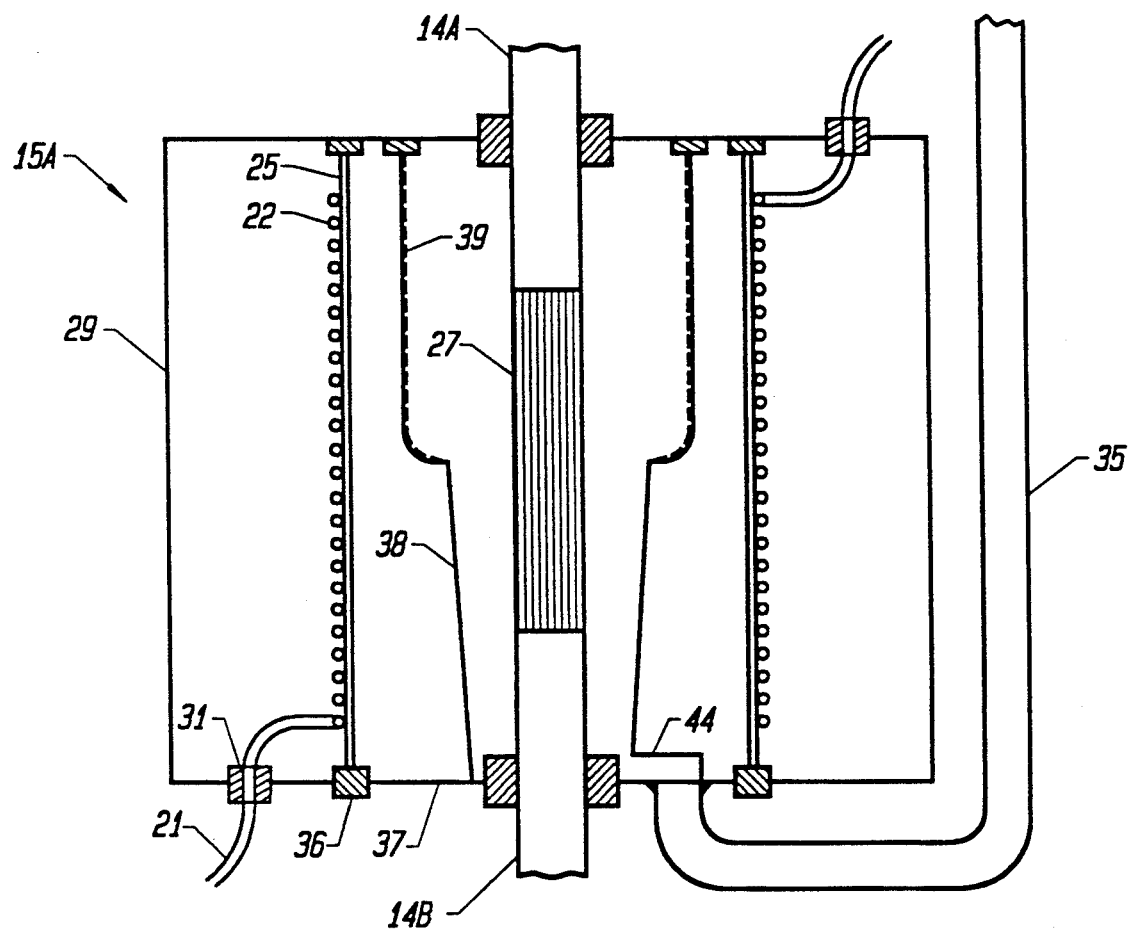
FIG. 10 is a cross-sectional view of a switch which may be used in zero gravitational field applications, in accordance with the present invention.

FIG. 10 illustrates a cross-section of the switch of FIG. 4 modified so as to be suitable for operation in space. The switch 15A is modified by the addition of a zero-g wetting tube 38. The action of the switch in this design depends upon the wetting of the fused link metal 27 for various surfaces rather than upon the presence of a gravity field; it is the function of the wetting tube 38 to provide the wettable surface in such a manner as to force the molten link metal 27 to flow away from one end of the cell conductor and to the base of the switch 15A where a connection to a by-pass conductor 35 is made.

The wetting tube 38 is preferably constructed of a metal such that its surface is wetted by the molten link metal. Preferably, the wetting tube is configured to take advantage of the capillary rise characteristics of a tube that is wetted by a liquid. Therefore, the wetting tube 38 preferably consists of two sections. The first region has a wide and constant diameter, the interior of this region includes a coating 39 which makes the tube nonpreferentially wetted by the molten link metal. The other section of the zero-g wetting tube 38 is of a tapered design, varying in diameter from wide at the middle of the fusible link area to a smaller diameter at the end attached to the base of the housing 29.

In operation, the zero-g form of the switch 15A of this invention receives activation power in the coil 22 of the switch 15A upon the sensing of a failed or failing cell. The fusible link 27 begins to melt and forms a sphere in accordance with the forces of surface tension acting upon a liquid. This stage is illustrated in FIG. 11, in which the fusible link 40 is shown in the process of melting and forming a sphere.

Preferably, coil 22 is wound around coil support 25 in such a way as to provide more heat at the ends of the fusible link as opposed to the center, thus encouraging the fusible link to melt in a more uniform manner along its length. As the metal of the fusible link 27 continues to melt, it tends to form a sphere, the sphere of molten mass will increase until such time as the surface of the molten metal touches the wetting tube at its narrowest part in the middle of the fusible link 27. At that time, the forces of surface tension will cause the metal to flow to the surface of the wetting tube, and, in accordance with the forces described in capillary rise equations, the liquid metal will be drawn to the more narrow end of the wetting tube.

This behavior is further encouraged by the addition to the surface of the wetting tube of a non-wettable coating 39 in the larger-diameter, cylindrical, portion of the tube 38. After the fused metal has flowed to its limit, it will have collected at the most narrow end of the wetting tube 38. More particularly, the fused metal will flow into chamber 44 of tube 38, where it makes an electrical contact with bypass 35. Of course, in a parallel cell arrangement, the chamber 44 would not be required; in a parallel cell arrangement the fused metal 32A of the fusible link 27 is disengaged from cell conductor 14 and therefore an open circuit is created. The final stage of an activated zero-g switch in a series cell arrangement is shown in FIG. 12.

Having provided a description of the operation of the present invention, attention presently focuses upon some of the details of a preferable embodiment of the invention.

Preferably, fuse housing 29 forms a hermetically sealed envelope. The space within the housing 29 can be a vacuum or a dry and inert gas. An appropriate sealing material must be used between the housing 29 and external components such as cell conductor 14 and activation wire 21. The sealing material must accommodate differences in coefficients of thermal expansion. Appropriate seals are well-known in the art.

The housing 29 may be made of borosilicate glass with seals to the cell conductor 14 being made with graded seal glass. The housing 29 may be made of steel and insulated from the conductor 14 by use of electrical feed-through connectors as is common in the electronic cathode-ray tube technology employed in television tubes.

If the switch 15 is designed to operate with cells that normally operate near room temperature, the fusible link 27 material can be a low melting metal. Wood's metal is a metallic alloy which would be suitable. In addition, the lead-metal alloys commonly used in electrical fuses would be suitable.

Similarly, with ambient temperature batteries or with space power supplies, the fusible link 27 may be made of any of a number of fusible alloys having melting points ranging from 50 to 200 degrees centigrade and made principally of bismuth, lead, and tin metals, all of which are slow to oxidize at room temperature and which do not tend to form structurally supportive oxide skins and thus may be used directly as fusible links.

For the switches of this invention that are intended to be used with high-temperature batteries, such as sodium:sulfur batteries, the fusible link must be made of a metal whose melting point is above the normal cell operating temperature. Zinc, aluminum, and various alloys of such metals would be suitable.

Many metals tend to form a structurally strong oxide layer on the surface of the metal. For instance, aluminum forms such a surface. The presence of such a coating can interfere or stop the intended flowing action of the fusible link 27. Accordingly, it is desirable to remove that coating before sealing in the hermetically sealed housing 29.

Preferably, a thin layer of a metal is formed over the aluminum to protect the metal from oxidation while being processed into the sealed switch enclosure. A non-active metal coating of lead or tin metals may be used. The layer of metal may be deposited on the aluminum by dipping the aluminum in a fused salt mixture including lithium and potassium chlorides. Preferably, 5 weight percent of lithium fluoride is also included in the mixture. The fluoride will complex the surface oxide and expose fresh aluminum metal. Alternatively, a commercial flux by the name of "ALUM-A-FLUX No. 1", manufactured by Forney Arc Welders, Fort Collins, Colo., has been used. To assure that the fresh aluminum surface is coated with metal the instant it is exposed by dissolution of the oxide, preferably, 5 weight percent of either lead or tin oxide is added to the mixture. The effect of adding a metal such as lead is to allow a replacement reaction to proceed. The reducing potential of the aluminum metal is adequate to quickly reduce the lead ion to lead metal.

If the base metals such as lead or tin are not included in the mixture, the aluminum conductor will be cleaned of the oxide coating and, if protection is provided against significant re-oxidation during assembly of the switch 15, the salt-coated wire can itself be used in fabrication. However, the salt-coated wire cannot be bent in handling and is not convenient to work with, partly because of its hygroscopic nature. Accordingly, the cleaned and base metal coated wire is a preferred embodiment.

In one embodiment of the present invention, aluminum wire of very high purity (99.999%) has been used. This, however, would be too costly for commercial use, accordingly, a form of aluminum (ASTM 1350-H19EC Aluminum) that is used in making electrical cable for power lines of the electric utility has been used.

A nickel chromium alloy may be used for coil 22. Various forms of alloys suitable for such use exist and are known by such trade names as "Nichrome", "Tophet", or "Constantan". An adequate insulating material for the heater coil support 2 is fused silica, aluminum oxide, or various commercial forms of aluminum oxide based ceramics such as "Morganite" or, for lower temperature applications, borosilicate glasses, such as "Pyrex".

In one configuration of the present invention, 18 gauge "Nichrome" wire was wound on a fused-silica support 25. Then, 25 to 50 watts of heating power was applied to the coil 22. This level of power was capable of raising the temperature of 00 gauge (nominally $\frac{1}{4}$ inch diameter) aluminum wire used as the fusible link 27 to its melting point within five minutes.

The zero-g wetting tube 38 may be made of tin metal or tin-plated steels when used with the lower temperature forms of the switch. The non-wetted portions of the surface may be made by proper surface treatment such as chromating (for instance, "Parkarizing") the surface, or plating copper on the metal and then converting the copper to a sulfide or oxide. For the higher temperature forms of the wetting tube, a steel base that is chromated for the non-wetting surface, and, for the wettable surface, that is first copper plated and then flashed with gold is preferred.

Preferably, the sampling device 20 and logic circuit 33 are remotely located from the battery 10 and therefore remain at ambient temperature regardless of the temperature of operation of the battery of cells. In one form of the logic circuitry, the following major equipment has been successfully used: Apple Macintosh Computer; IOTech Model Mac 488B Mac to IEEE Interface; Keithley Model 706 Scanner with ten switching cards (capable of handling 200 cell sensing inputs); Keithley Model 199 digital voltmeter; and interfacing software written in Microsoft QuickBasic.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An apparatus for locating and electrically isolating failed cells in a network of cells within a battery, said apparatus comprising:
    means for determining the condition of said cells of said network of cells of said battery so as to identify a failed cell, said determining means including:
    means for sampling the electrical properties of said cells of said battery;
    means for interpreting said electrical properties of said cells to determine the condition of said cells; and
    means for conveying an activation signal to said failed cell; and
    means for altering the electrical connection between said filed cell and said network of cells of said battery, said altering means being coupled and responsive to said determining means.

2. The apparatus of claim 1 wherein said sampling means is a sequential sampling multiplexer.

3. The apparatus of claim 1 wherein said interpreting means includes a microprocessor.

4. The apparatus of claim 1 wherein said switching means includes a microprocessor coupled to said failed cell.

5. The apparatus of claim 1 wherein said altering means includes a switch which alters the electrical connection between said failed cell and said network of cells of said battery.

6. The apparatus of claim 5 wherein said switch includes a fusible link.

7. The apparatus of claim 6 wherein said fusible link is melted by a coil.

8. The apparatus of claim 7 wherein said fusible link is positioned within a sealed housing.

9. The apparatus of claim 8 wherein said fusible link is positioned within a wetting tube which is positioned within said housing.

10. The apparatus of claim 6 wherein said fusible link includes a metal coating.

11. An apparatus for locating and electrically isolating failed cells in a network of cells within a battery so as to prevent a failed cell from interfering with the operation of functional cells, said apparatus comprising:
    means for sampling the electrical properties of said cells of said battery;
    means for interpreting said electrical properties of said cells to determine the condition of said cells;
    means for generating an activation signal to a cell in response to said interpreting means; and
    means for conveying said activation signal to a switch positioned at said failed cell, said switch including means for melting a fusible link associated with said switch, whereby the melted fusible link results in a connection isolating said failed cell from said network of cells so as to prevent said failed cell from interfering with the operation of functional cells in said batter.

12. The apparatus of claim 11 wherein said sampling means includes a sequential sampling multiplexer.

13. The apparatus of claim 11 wherein said comparing means and said switching means include a microprocessor.

14. The apparatus of claim 11 wherein said switch includes a sealed housing.

15. The apparatus of claim 14 wherein said fusible link is positioned within a wetting tube which is positioned within said housing.

16. The apparatus of claim 11 wherein said fusible link is formed of aluminum and includes a metal coating.

17. A method for locating and electrically isolating failed cells in a network of cells within a battery, said method comprising the steps of:

sampling the electrical properties of said cells of said battery;

interpreting said electrical properties of said cells to determine the condition of said cells;

conveying an activation signal to said failed cell in response to said interpreting step; and altering the electrical connection between said failed cell and said network of cells of said battery in response to said activation signal.

18. The method of claim 17 wherein said altering step includes heating a fusible link of a switch associated with said failed cell so as to alter the electrical connection between said failed cell and said network of cells of said battery.

* * * * *